United States Patent
Yeo et al.

(10) Patent No.: US 9,961,763 B2
(45) Date of Patent: *May 1, 2018

(54) DRIVING PRINTED CIRCUIT BOARD FOR DISPLAY DEVICE AND DISPLAY DEVICE HAVING THE SAME

(71) Applicant: LG Display Co., Ltd., Seoul (KR)

(72) Inventors: InHo Yeo, Gumi-si (KR); KyongShik Jeon, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/410,485

(22) Filed: Jan. 19, 2017

(65) Prior Publication Data

US 2017/0135201 A1    May 11, 2017

Related U.S. Application Data

(63) Continuation of application No. 14/846,234, filed on Sep. 4, 2015, now Pat. No. 9,585,252.

(30) Foreign Application Priority Data

Sep. 5, 2014 (KR) .......... 10-2014-0119081

(51) Int. Cl.
*H05K 7/10* (2006.01)
*H05K 7/12* (2006.01)
(Continued)

(52) U.S. Cl.
CPC ......... *H05K 1/0218* (2013.01); *H05K 1/0296* (2013.01); *H05K 1/111* (2013.01);
(Continued)

(58) Field of Classification Search
USPC .................. 361/767, 752, 808
See application file for complete search history.

(56) References Cited

U.S. PATENT DOCUMENTS 7,800,730 B2 * 9/2010 Kang ............ G02F 1/133615
349/149
2002/0027621 A1    3/2002 Chae
(Continued)

FOREIGN PATENT DOCUMENTS

CN    101175368 A    5/2008
CN    101354861 A    1/2009
(Continued)

OTHER PUBLICATIONS

Office Action for Chinese Patent Application No. CN 20150561214.0, Jan. 23, 2018, 12 Pages, (With English Translation).

*Primary Examiner* — Andargie M Aychillhum
(74) *Attorney, Agent, or Firm* — Fenwick & West LLP

(57) ABSTRACT

An electronic device connection unit includes a substrate and a plurality of signal pads on the substrate configured to send signals from an electronic device to a driving printed circuit board (PCB). One or more active ground pads on the substrate are configured to connect at least the driving PCB to a reference voltage of the electronic device. One or more dummy ground pads on the substrate are configured to connect to the reference voltage of the electronic device without extending onto the driving PCB. One or more connectors are connected to the one or more dummy ground pads, where each of the one or more connectors is configured to electrically couple at least a subset of the one or more dummy ground pads to the one or more active ground pads.

20 Claims, 7 Drawing Sheets

(51) Int. Cl.
*H05K 1/02* (2006.01)
*H05K 1/11* (2006.01)
*H05K 1/14* (2006.01)

(52) U.S. Cl.
CPC ............ *H05K 1/117* (2013.01); *H05K 1/14* (2013.01); *H05K 1/0219* (2013.01); *H05K 1/118* (2013.01); *H05K 2201/04* (2013.01); *H05K 2201/09709* (2013.01); *H05K 2201/09727* (2013.01); *H05K 2201/09781* (2013.01); *H05K 2201/10128* (2013.01)

(56) References Cited

U.S. PATENT DOCUMENTS

| | | |
|---|---|---|
| 2008/0001892 A1* | 1/2008 | Kim .................. G02F 1/1345 345/97 |
| 2014/0078705 A1 | 3/2014 | Jo |
| 2016/0073498 A1 | 3/2016 | Yeo et al. |

FOREIGN PATENT DOCUMENTS

| CN | 101794617 A | 8/2010 |
|---|---|---|
| KR | 20060134291 A | 12/2006 |

\* cited by examiner

DRIVING PRINTED CIRCUIT BOARD FOR DISPLAY DEVICE AND DISPLAY DEVICE HAVING THE SAME

CROSS-REFERENCE TO RELATED APPLICATIONS

This application is a continuation application of, and claims priority under 35 U.S.C. § 120 from, U.S. patent application Ser. No. 14/846,234 filed on Sep. 4, 2015, which claims the benefit under 35 U.S.C. § 119(a) of Korean Patent Application No. 10-2014-0119081, filed on Sep. 5, 2014, both of which are hereby incorporated by reference for all purposes as if fully set forth herein.

BACKGROUND OF THE DISCLOSURE

1. Field of the Disclosure

The present disclosure relates to a driving printed circuit board for a display device and a display device having the driving printed circuit board for a display device, and more particularly to a driving printed circuit board (PCB) for connecting an electronic device for a display device to a display panel, and a display device having the driving PCB.

2. Description of the Prior Art

With the development of the information society, various types of requirements for a display device for displaying an image are increasing and, recently, various display devices, such as a liquid crystal display (LCD), a plasma display panel (PDP), and an organic light emitting diode display device (OLED), are being used.

An LCD includes an array substrate including a thin film transistor, an upper substrate including a color filter, a black matrix and/or the like, and a liquid crystal material layer forted between the array substrate and the upper substrate. The LCD is a device in which an arrangement state of a liquid crystal layer is controlled according to an electric field applied to both electrodes of a pixel area. Therefore, transmittance of light is controlled, and thus an image is displayed.

A display panel of the LCD is defined as an active area (AA), which provides an image to a user, and a non-active area (NA), which is adjacent to the AA. The display panel is commonly manufactured by combining a first substrate with a second substrate. The first substrate is the array substrate, in which the pixel area is defined by the forming of the thin film transistor. The second substrate is the upper substrate, in which the black matrix and/or the color filter layer are formed.

The array substrate or the first substrate in which the thin film transistor is formed includes a plurality of gate lines (GLs) extending in a first direction, and a plurality of data lines (DLs). One pixel area (e.g., P) is defined by each gate line and each data line. In one pixel area (e.g., P), at least one thin film transistor may be formed, and a gate electrode or a source electrode of each thin film transistor may be connected to each gate line and data line.

In addition, in order to provide a gate signal and a data signal necessary to drive each pixel to each gate line and data line, a gate driving unit (i.e., a gate driving circuit), a data driving circuit or the like is formed in the NA or outside of the panel.

Among these, the gate driving circuit may be formed on the NA of the display panel in a process of forming various signal lines and a pixel of the display panel. Thus, the gate driving circuit may be implemented as a gate in panel (GIP) type in which the gate driving circuit is included in the panel.

However, the gate driving circuit and the data driving circuit may be included in the same driver IC and may be separately disposed under the display panel.

Meanwhile, the display panel including the data driving circit (i.e., D-IC) may be expressed as a liquid crystal monitor. The liquid crystal monitor is connected to a customer system such as a mobile phone, a PC, or a tablet PC, receives a data signal from the customer system, and is operated as a display device for the customer system.

In addition, a driving printed circuit board, which is connected to the liquid crystal monitor to provide various signals to the gate driving circuit and the data driving circuit included in the liquid crystal monitor, is provided. Various driving elements including a timing controller are mounted on the driving printed circuit board. One end of the driving printed circuit board (PCB) is coupled to the liquid crystal monitor through a flexible printed circuit board (FPC) or a flexible circuit film, and another end of the driving PCB is connected to a connection unit of the customer system through a connector (i.e., CNT) unit in which various terminals or pads are formed.

Meanwhile, in order to provide an electrical stability of various signal lines formed in a main circuit unit of the driving PCB, at least one dummy ground pad may be formed in the connector (i.e., CNT) unit of the driving PCB for the customer system. Some of the ground pads may not be electrically connected to a ground, and may be floated.

As described above, the ground pad floated in the connector (i.e., CNT) unit of the driving PCB for the customer system may possess a static electricity or an external inflow charge, and then the static electricity or the external inflow charge may flow into the liquid crystal monitor while connecting the driving PCB with the customer system. Thus, the ground pad may bring about various defects to the liquid crystal monitor.

SUMMARY OF THE DISCLOSURE

An electronic device connection unit is provided. In one embodiment, the electronic device connection unit includes a substrate. A plurality of signals pads on the substrate are configured to send signals from an electronic device to a driving printed circuit board (PCB). One or more active ground pads on the substrate are configured to connect at least the driving PCB to a reference voltage of the electronic device. One or more dummy ground pads are disposed on the substrate without extending onto the driving PCB. The one or more dummy ground pads are configured to connect to the reference voltage of the electronic device. One or more connectors are connected to the one or more dummy ground pads, where each of the one or more connectors is configured to electronically couple at least a subset of the one or more dummy ground pads to the one or more active ground pads.

A driving printed circuit board (PCB) coupling a display panel to an electronic device is also provided. The driving PCB includes a substrate and a plurality of signal lines disposed on the substrate. The signal lines are configured to receive signals from the electronic device for driving the display panel. The driving PCB also includes one or more ground metal patterns on the substrate, and applies a reference voltage to the one or more ground metal patterns. An electronic device connection unit of the driving PCB is configured to connect the driving PCB to the electronic device. The electronic device connection unit includes a plurality of signal pads on the substrate and coupled to the signal lines of the driving PCB. The signal pads are configured to send signals from the electronic device to the driving PCB. One or more active ground pads on the substrate are coupled to the ground metal patterns of the driving PCB, where the one or more active ground pads are configured to connect at least the driving PCB to a reference voltage of the electronic device. One or more dummy ground pads of the electronic device connection unit, disposed on the substrate without extending onto the driving PCB, are configured to connect to the reference voltage of the electronic device. One or more connectors are connected to the one or more dummy ground pads. Each of the one or more connectors is configured to electrically couple at least a subset of the one or more dummy ground pads to the one or more active ground pads.

An electronic device connection unit is also provided. The electronic device connection unit includes a substrate and a plurality of signal pads on the substrate. The signal pads are configured to send signals from an electronic device to a driving printed circuit board (PCB). One or more active ground pads on the substrate are configured to connect at least the driving PCB to a reference voltage of the electronic device. One or more dummy ground pads are disposed on the substrate without extending onto the driving PCB. The one or more dummy ground pads are configured to connect to the reference voltage of the electronic device. One or more connectors are connected to the dummy ground pads. Each of the connectors is configured to electrically couple at least a subset of the one or more dummy ground pads to the one or more active ground pads.

BRIEF DESCRIPTION OF THE DRAWINGS

The above and other objects, features and advantages of the present disclosure will be more apparent from the following detailed description taken in conjunction with the accompanying drawings, in which:

FIG. 2 is an enlarged plan view of the customer system connector unit, and FIG. 3 is an equivalent circuit diagram for the customer system connector;

DETAILED DESCRIPTION OF THE EXEMPLARY EMBODIMENTS

Figure 1A:
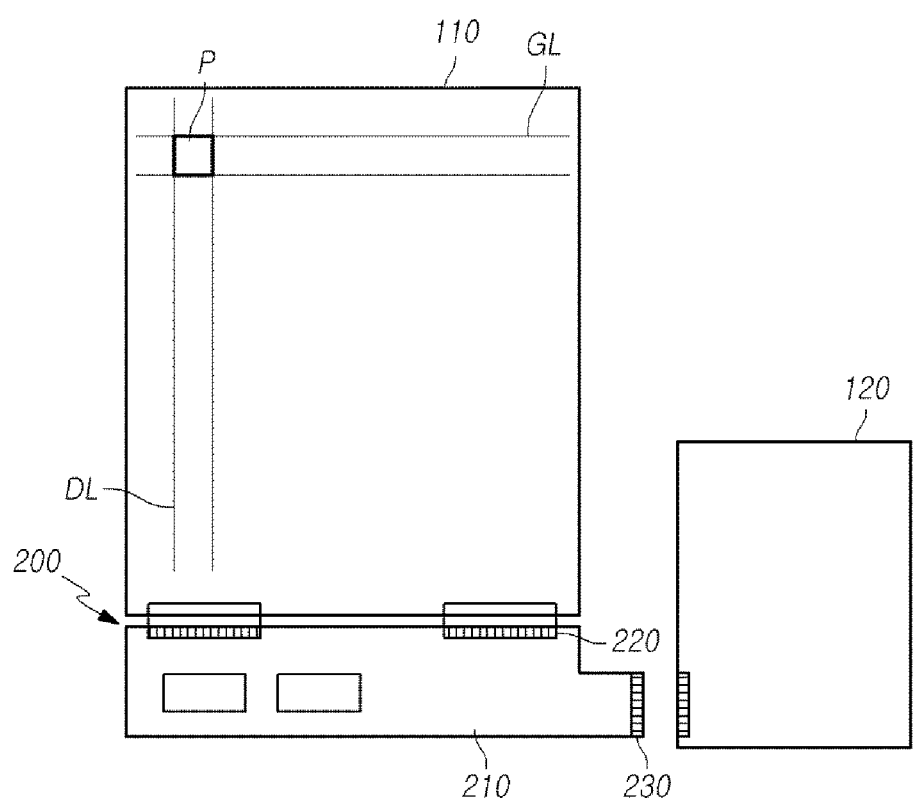
FIGS. 1A and 1B are configuration diagrams of a display device including a display panel, a customer system and a driving printed circuit board which connects the display panel to the customer system.

Hereinafter, embodiments of the present disclosure will be described with reference to the accompanying drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

Furthermore, in the description of the structural elements of the present disclosure, terms of "first", "second", "A', "B", "(a)", "(b)" and the like may be used. Each of these technologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

Figure 1B:
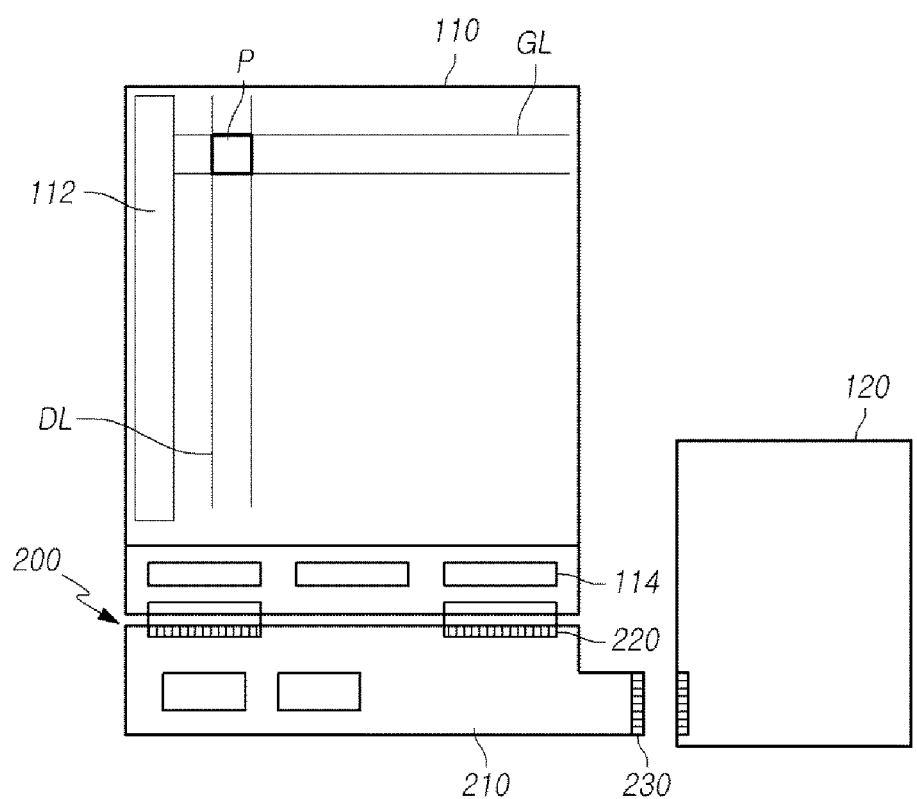

FIGS. 1A and 1B are configuration diagrams of a display device including a display panel, a customer system and a driving printed circuit board which connects the display panel to the customer system.

A detailed configuration diagram of a display device to which an embodiment of the present disclosure may be applied may include a display panel 110, a customer system 120 such as a user terminal, a test device, or the like, and a driving printed circuit board (PCB) 200. Here, the driving PCB 200 may connect the display panel with the customer system, and may include a connector unit connected to the customer system. In addition, various driving elements of a display device may be mounted on the driving PCB 200.

The display panel 110 may be a liquid crystal display panel, but is not limited thereto. That is, the display panel 110 may be another type of display panel such as an organic light emitting diode (OLED) display device, a plasma display panel (PDP) and the like.

That is, a type of a display panel which may be connected to the driving PCB 200 according to an embodiment of the present disclosure is not limited to a specific type.

But, for convenience of understanding, hereinafter, the display panel according to an embodiment of the present disclosure is regarded as the liquid crystal display panel.

The liquid crystal display panel which is the display panel 110 includes an array substrate as a lower substrate, a color filter substrate as an upper substrate, and a liquid crystal layer injected between the array substrate and the color filter substrate. The array substrate includes a plurality of gate lines, a plurality of data lines, and a plurality of thin film transistors. The color filter substrate includes a color filter and a black matrix.

A plurality of pixels P which are defined as crossing areas of the gate lines GL and the data lines DL are formed in the display panel 110. That is, in the lower array substrate, the data lines and the gate lines cross, and the pixels including m*n (each of m and n is a positive integer) liquid crystal cells (i.e., Clc) are formed in a matrix type. In the display panel 110, k (k is a positive integer) dummy lines (not shown) may be further formed.

Each liquid crystal cell (i.e., Clc) includes a thin film transistor (TFT), a pixel electrode connected to the TFT, a storage capacitor Cst, and the like. The liquid crystal cell (Clc) is driven by a voltage difference between a pixel electrode and a common electrode, adjusts transmittance of incident light, and thus implements a display image corresponding to an image data. Here, the pixel electrode charges a data voltage through the TFT, and the common electrode receives a common voltage (i.e., Vcom).

The black matrix, the color filter and the common electrode are formed on an upper glass substrate of the display panel 110. The common electrode is formed on the upper glass substrate in a vertical electric field driving method such as a TN mode and a VA mode. The common electrode may be formed on a lower glass substrate together with the pixel electrode in a horizontal electric field driving method such as an IPS mode or an FFS mode.

A gate driving circuit 112 for providing a gate output signal (i.e., Vout) to a gate line may be directly formed on the lower substrate of the display panel through a TFT array process according to a gate in panel (GIP) method.

That is, the gate driving circuit 112 may be formed in the non-active area (NAA) outside the active area (AA) of the display panel 110, and may be symetrically formed at left and right sides (or upper and lower sides) of the panel, but is not limited thereto.

The driving PCB 200 is a printed circuit board including a driving element such as a timing controller (i.e., T-CON) and a data driving circuit (i.e., D-IC). The driving PCB 200 may include a main substrate area 210 on which the driving element and various signal lines are formed, and a connector unit disposed at both sides of the main substrate area 210.

The connector unit may include a display panel connection unit 220 and a customer system connector unit 230. The display panel connection unit 220 is for connecting the driving PCB 200 to the display panel 110 through a flexible PCB (FPCB), a tape carrier package (TCP) or the like at one end of the driving PCB 200. The customer system connector unit 230 is for connecting the driving PCB 200 to a customer system such as a user terminal or test equipment.

The driving PCB 200 may be manufactured as a type of the FPCB. In the above, the driving PCB 200 includes the timing controller (i.e., T-CON), the data driving circuit (i.e., D-IC), and the like, but is not limited thereto.

That is, in an embodiment shown in FIG. 1A, the driving circuit may be not included in the display panel 110, and all driving circuit elements such as the timing controller, the gate driving circuit and the data driving circuit may be mounted on the driving PCB 200 which connects the display panel with the customer system 120.

In addition, in an embodiment shown in FIG. 1B, the display panel 110 may be a display panel of a chip on glass (COG) or a gate in panel (GIP) structure in which the gate driving circuit element is directly formed in the NA disposed at one side of the display panel 110.

In the embodiment of FIG. 1B, the gate driving circuit 112 may be formed in the display panel 110 and the data driving circuit (i.e., D-IC) 114 may be mounted in the display panel or a separate FPCB. Thus, in the driving PCB 200 defined in an embodiment of the present disclosure, the gate driving circuit or the data driving circuit may not be included, and other driving elements necessary to drive the display panel may be included.

As described above, the driving PCB 200 included in an embodiment of the present disclosure should be understood as a concept including all types of PCB, printed circuit film or the like, which include at least one element necessary to drive the display panel and is for connecting the display panel 110 or the liquid crystal monitor (LCM) to the customer system.

But, the driving PCB 200 includes the customer system connector unit 230 to be connected to the connection unit of the customer system 120, in addition to the main substrate area 210 in which the driving element and the like are disposed.

The customer system connector unit 230 of the driving PCB 200 may include a signal pad and a ground pad. Here, the signal pad is formed at an end portion of a plurality of signal lines extending from the main substrate area 210. The ground pad extends from a ground pattern formed in the main substrate area. In addition, the customer system connector unit 230 of the driving PCB 200 may include a plurality of dummy ground pads. When the customer system connector unit 230 of the driving PCB 200 is connected to the customer system, a ground signal is applied to the plurality of dummy ground pads, and the plurality of dummy ground pads are floated when considering only the driving PCB 200.

When the dummy ground pad is connected to the customer system, since the dummy ground pad electrically receives a ground signal, the dummy ground pad may play a role of increasing an electrical stability of various signal lines, especially a pair of signal lines. However, when the dummy ground pad is not connected to the customer system, an external charge due to an electrostatic discharge (ESD), an electrical overstress (EOS) or the like may be stored in the dummy ground pad, and then the external charge may flow into an adjacent pad. Thus, the dummy ground pad may bring about electrical damage to the display panel.

In the present disclosure, a driving PCB is provided for connecting a display panel and a customer system. The driving PCB includes a main substrate area including at least one display panel driving element, and a customer system connector unit formed at one end of the main substrate area and connected to a connection unit of the customer system. The customer system connector unit includes at least one dummy ground pad, and a connection line electrically connecting at least one of dummy ground pads to an adjacent ground pad.

Hereinafter, an embodiment of the present disclosure will be described in detail with reference to FIGS. 2 to 5.

Figure 2:
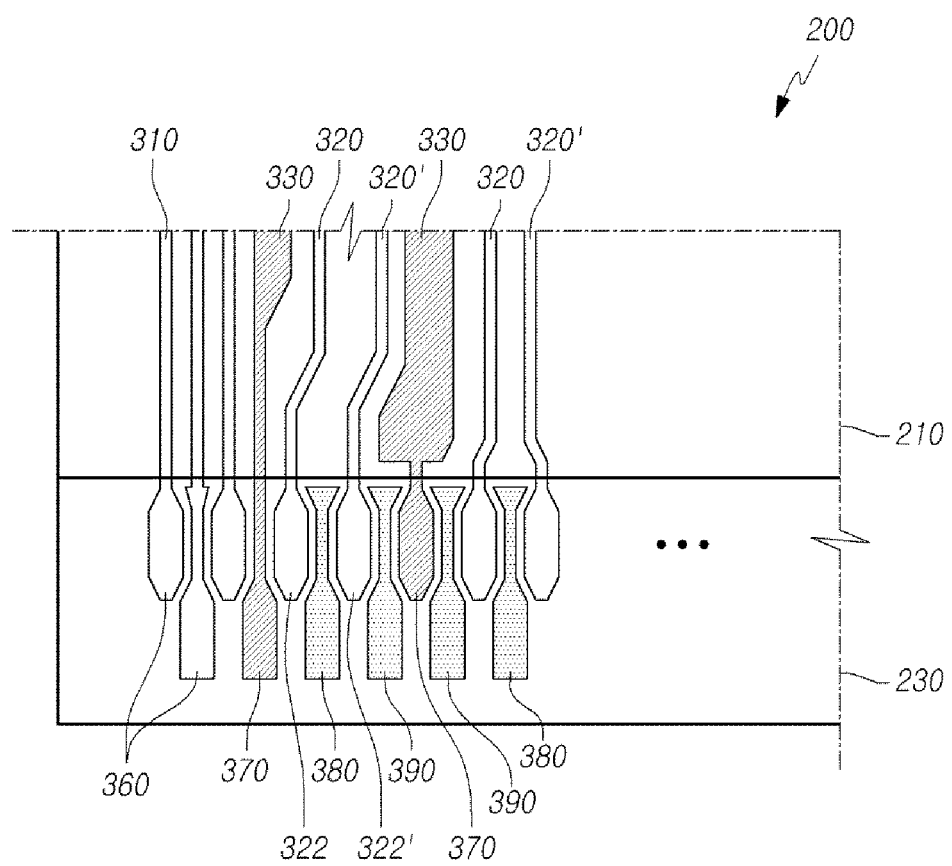
FIGS. 2 and 3 are views for a customer system connector unit of a driving PCB applied to an embodiment of the present disclosure.
Figure 3:
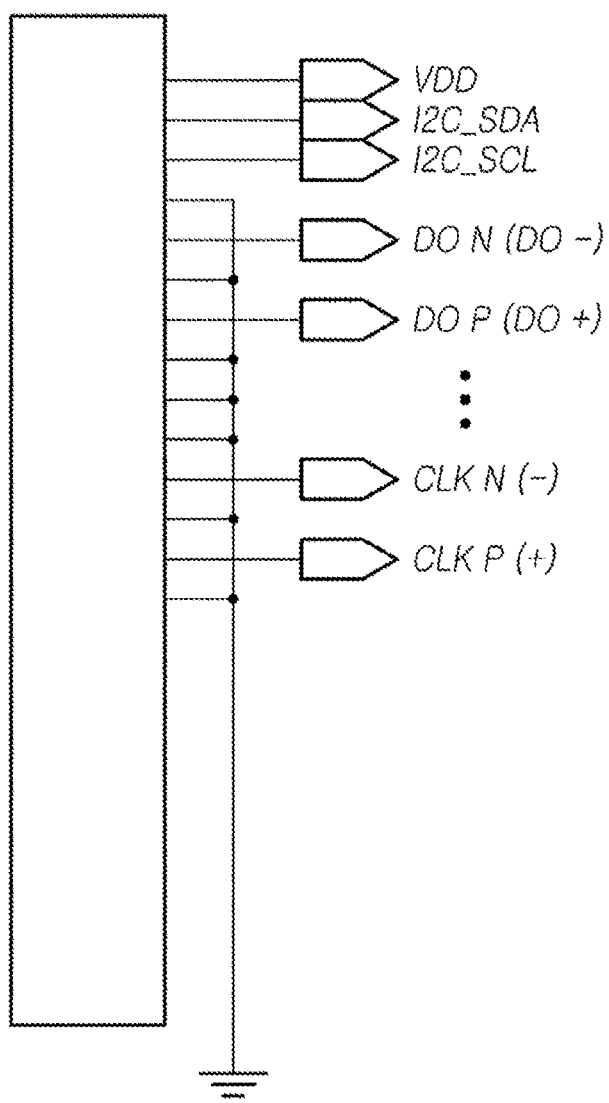

FIGS. 2 and 3 are views for a customer system connector unit of a driving PCB. FIG. 2 is an enlarged plan view of the customer system connector unit, and FIG. 3 is an equivalent circuit diagram for the customer system connector.

As shown in FIGS. 2 and 3, in the main substrate area 210, a plurality of signal lines 310 and 320 are formed. In the customer system connector unit 230, a plurality of signal pads 360 are extended from the signal lines and formed in an end portion of the signal lines.

In addition, a plurality of ground metal patterns 330 are formed in the main substrate area 210, and a ground signal is applied to the ground metal pattern in the driving PCB. Meanwhile, a ground pad 370 directly extending from the ground metal pattern 330 is formed in the customer system connector unit 230.

Meanwhile, the signal lines may include, for example, a single signal line 310 such as a high potential voltage signal (e.g., VDD), and a pair of signal lines 320 and 320' for providing a pair of differential signals.

The pair of signal lines 320 and 320' may be, for example, signal lines for providing a DO negative (DON) and a DO positive (DOP) signals, signal lines for providing a clock negative (CLKN) and a clock positive (CLKP) signals, or the like.

In one embodiment, the pair of signal lines are adjacently disposed so as to maximize a transmission characteristic, as a circuit type recently used often to change a parallel structure to a serial structure.

In addition, when the differential signal is provided through the pair of signal lines, electromagnetic Interference (EMI) is reduced by providing a ground signal to an adjacent area of the pair signal line to form a balanced electromagnetic field (EMF).

To this end, as shown in FIGS. 2 and 3, a plurality of the pair of signal lines 320 and 320' are formed in the main substrate area of the driving PCB 200, and a pair of signal pads 322 and 322' are formed at the end portions of each of the plurality of the pairs of signal lines 320 and 320'. Corresponding signals are applied to the pair of signal pads 322 from the customer system, and the signals are applied to the driving PCB 200 and the display panel 110 along the pair of signal lines 320 and 320'.

Meanwhile, as described above, a dummy ground pad 380 is formed between a pair of signal pads 322 and 322' for an electrical stability of the pair of signal lines. When the driving PCB 200 is connected to the customer system 120, since the ground signal is applied to the dummy ground pad from the customer system, the dummy ground pad secures the electrical stability of the pair of signal pads or the differential signal applied to the pair of signal pads.

In addition, at least one other dummy ground pad may be formed between a pair of signal pads and adjacent to another pair of signal pads.

In the present specification, the dummy ground pad formed between a pair of signal pads 320 and 320' is distinguished and described as a first dummy ground pad 380, and two dummy ground pads disposed between adjacent pairs of signal pads are distinguished and described as a second dummy ground pad 390.

When the first dummy ground pad 380 and the second dummy ground pad 390 are connected to the customer system, the first dummy ground pad 380 and the second dummy ground pad 380 receive the ground signal from the customer system, and thus improve the electrical stability of the pair of signal lines and the like. However, before the first dummy ground pad 380 and the second dummy ground pad 390 are connected to the customer system, the first dummy ground pad 380 and the second dummy ground pad 390 are electrically floated based on the driving PCB.

In FIG. 2, for the convenience of description, the single signal pad 360 and the pair of signal pads 322 which are signal pads to which various signals are applied are shown in white without a shadow, the ground metal pattern 330 formed in the main substrate and the ground pad 370 directly extending from the ground metal pattern 330 are shown as a deviant crease line shadow, and the first dummy ground pad 380 and the second dummy ground pad 390 are shown as a gray area.

The first dummy ground pad 380 and the second dummy ground pad 390 are metal patterns electrically floated before the first dummy ground pad 380 and the second dummy ground pad 390 are connected to the customer system. Therefore, the first dummy ground pad 380 and the second dummy ground pad 390 may possess a static charge or other abnormal charges generated in the outside, and then the abnormal external charges possessed in the first dummy ground pad 380 and the second dummy ground pad 390 may flow into an adjacent pad and the like. Thus, the abnormal external charge may damage elements in the driving PCB or the display panel.

Thus, in an embodiment of the present disclosure, the dummy ground pad formed in the customer system connector unit of the driving PCB connecting the display panel to the customer system is coupled to an adjacent ground pad to resolve the above-mentioned problems.

Figure 4:
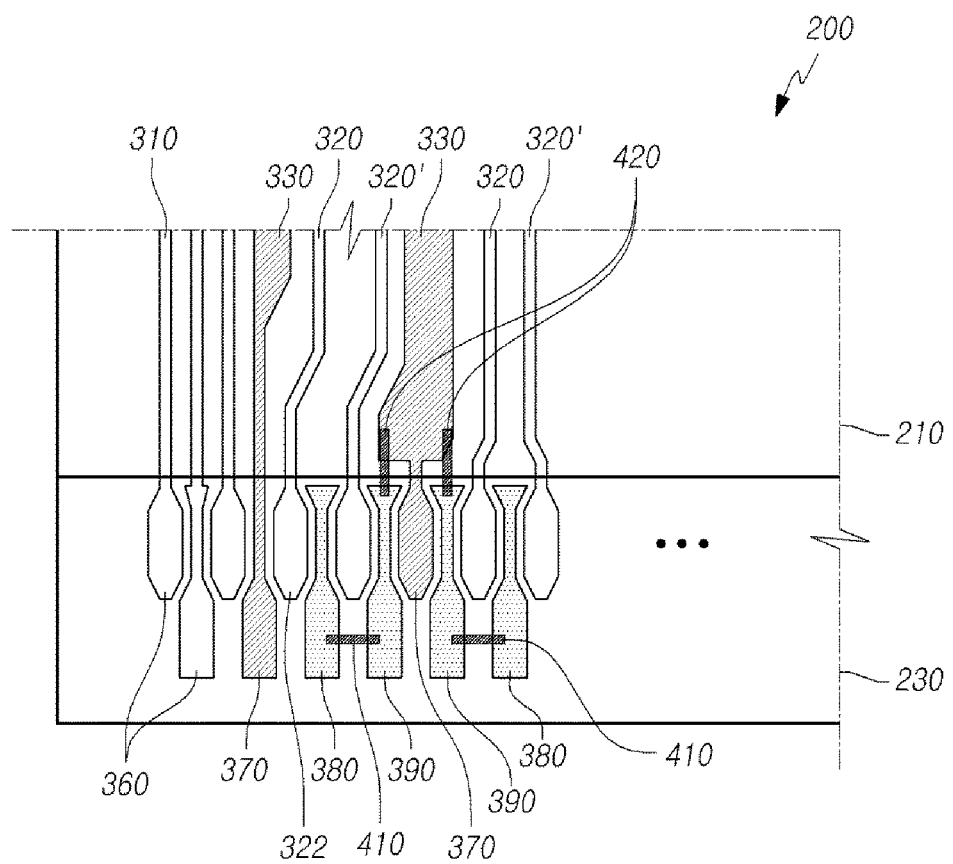
FIG. 4 is an enlarged plan view of the customer system connector unit of the driving PCB according to an embodiment of the present disclosure.

FIG. 4 is an enlarged plan view of the customer system connector unit 230 of the driving PCB according to an embodiment of the present disclosure.

As shown in FIGS. 1A and 1B, the driving PCB by an embodiment of the present disclosure is provided to connect the display panel 110 to the customer system 120. The driving PCB includes the main substrate area 210 including at least one display panel driving element, and the customer system connector unit 230 formed at one end of the main substrate area and connected to a connection unit of the customer system. The customer system connector unit 230 includes at least one dummy ground pad, and at least one of the dummy ground pads is electrically connected to an adjacent ground pad through a connection line.

More specifically, as shown in FIG. 4, at least one single signal line 310 and at least one pair of signal lines 320 and 320' are formed in the main substrate area 210, and at least one ground metal pattern 330 is formed between signal lines.

In addition, in the customer system connector unit 230 of the driving PCB 200, the pair of signal pads 322 and 322' extending from the pair of signal lines are formed, the first dummy ground pad 380 disposed between the two signal pads included in a pair of signal pads is formed, and two second dummy ground pads 390 are formed between adjacent pairs of signal pads, i.e between one pair of signal pads and adjacent to another pair of signal pads. In addition, the ground pad 370 directly extending from the ground metal pattern 330 of the main substrate area is also formed in the customer system connector unit 230 of the driving PCB 200.

In the embodiment of FIG. 4, the second dummy ground pad 390 is electrically connected to the ground metal pattern 330 disposed on the main substrate area through an additional connection line 420, and the first dummy ground pad 380 is connected to the adjacent second dummy ground pad 390 through the connection line 410.

That is, in the embodiment of FIG. 4, since the second dummy ground pad 390 connected to the ground metal pattern 330 through the additional connection line 420 performs as a type of ground pad function and the first dummy ground pad disposed between two signal pads 322 and 322' included in the pair of signal pads is connected to the ground pad through the connection line 410, the first and second dummy ground pads are taken out of a floating state.

As described above, according to the embodiment of FIG. 4, since both of the first and second dummy ground pads 380 and 390 are electrically connected to the ground metal pattern to which the ground signal is applied in the driving PCB 200, the first and second dummy ground pads 380 and 390 are taken out of the floating state. Therefore, although the driving PCB 200 is not connected to the customer system, damage of the display panel or the driving circuit unit from the external electrical shock such as ESD or EOS may be prevented.

That is, as described in the embodiment of FIG. 4, the dummy ground pad is electrically grounded even when the driving PCB 200 is not connected to the customer system 120. Therefore, although the dummy ground pad may accumulate abnormal charge when the driving PCB 200 is not connected to the customer system 120, the connections to the ground metal patterns of the driving PCB 200 dissipate the abnormal charge from the dummy ground pads to reduce damage to the driving PCB 200.

Figure 5:
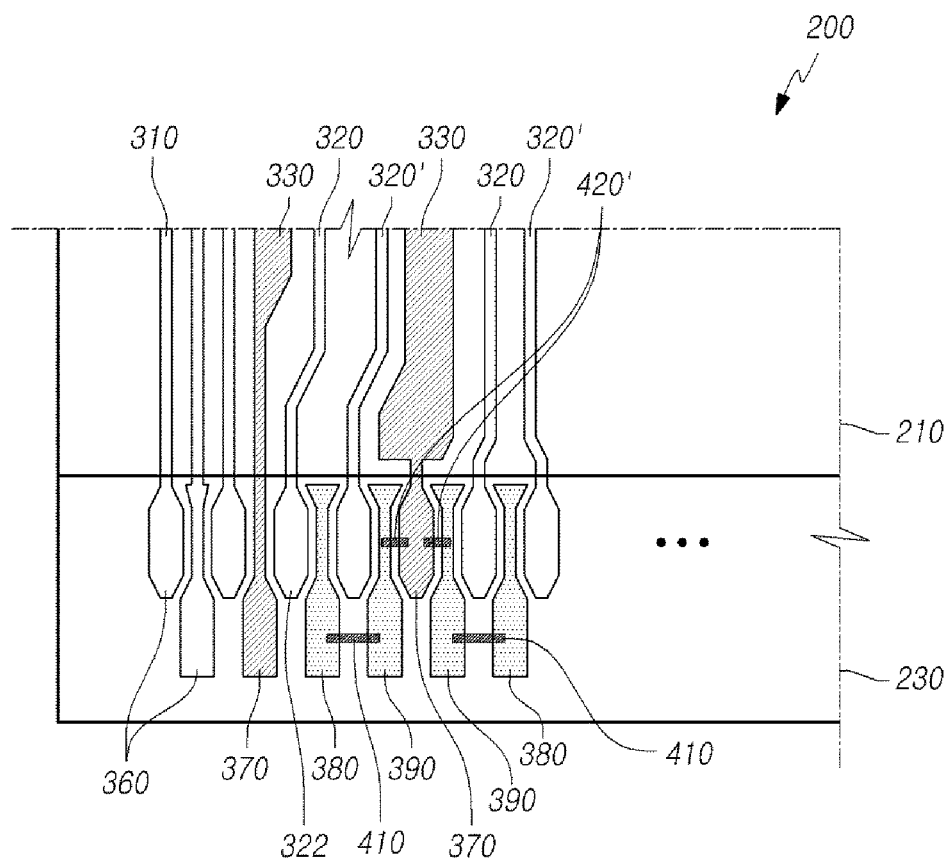
FIG. 5 is an enlarged plan view of a customer system connector unit of a driving PCB according to another embodiment of the present disclosure.

FIG. 5 is an enlarged plan view of a customer system connector unit 230 of a driving PCB 200 according to another embodiment of the present disclosure.

The embodiment of FIG. 5 has a similar configuration to the embodiment of FIG. 4, and only a position where an additional connection line 420' is formed is different from that of the embodiment of FIG. 4.

That is, in the embodiment of FIG. 4, the additional connection line 420 for electrically connecting the second dummy ground pads 390, which are two dummy ground pads disposed between the adjacent pairs of signal pads 322 and 322', to the ground connects the second dummy ground pads 390 directly to the ground metal pattern 330 of the driving PCB.

In contrast, in the embodiment of FIG. 5, since the second dummy ground pad 390 is directly connected to the ground pad 370 rather than the ground metal pattern 330 through the additional connection line 420' extending in a horizontal direction, the embodiment of FIG. 5 is differentiated from the embodiment of FIG. 4.

In the embodiment of FIG. 5 as well, similar to the embodiment of FIG. 4, since both of the first and second dummy ground pads 380 and 390 are electrically coupled to the ground metal pattern to which the ground signal is applied in the driving PCB 200, even though the driving PCB is not connected to the customer system, the electrical damage of the display panel and the like from external electrical shock may be prevented.

Figure 6:
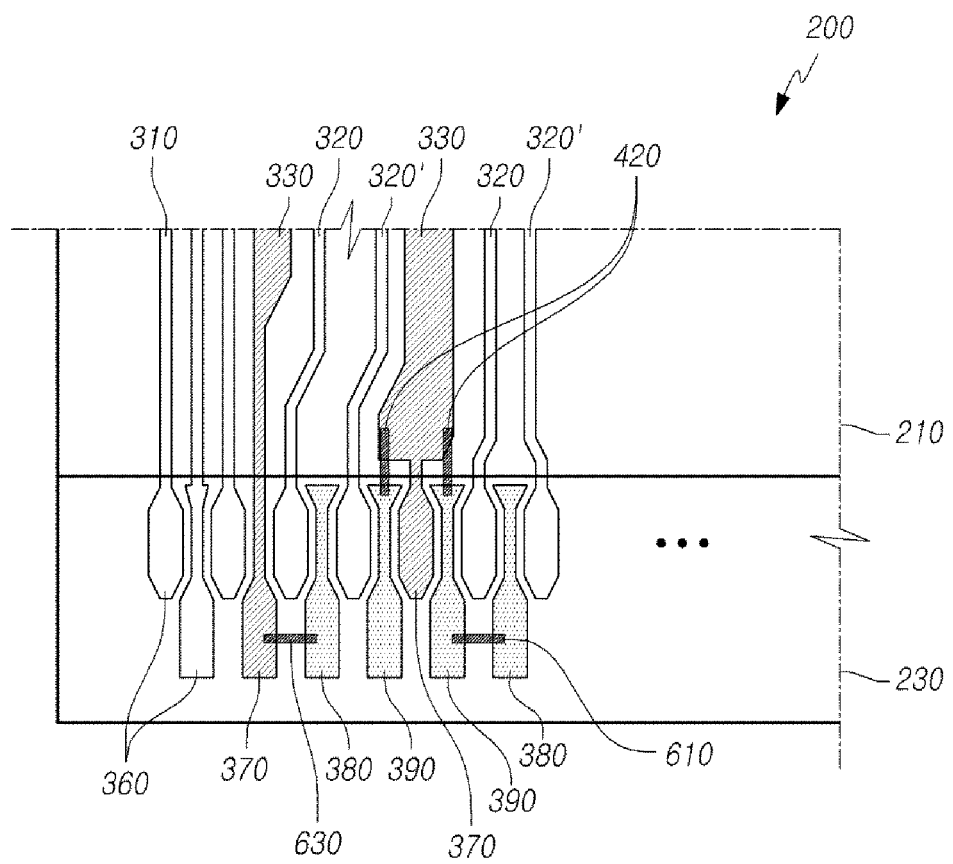
FIG. 6 is an enlarged plan view of a customer system connector unit of a driving PCB according to another embodiment of the present disclosure.

FIG. 6 is an enlarged plan view of a customer system connector unit 230 of a driving PCB 200 according to another embodiment of the present disclosure.

Differently from the embodiments of FIGS. 4 and 5, in which the first dummy ground pad 380 is connected to only the second dummy ground pad 390 adjacent to the first dummy ground pad 380, in an embodiment of FIG. 6, the first dummy ground pad 380, which is disposed between the two signal pads 322 and 322' included in a pair of signal pads and is floated, is directly connected to the ground pad 370 adjacent to the first dummy ground pad 380.

That is, in the embodiment of FIG. 6, the customer system connector unit may include a first connection line 630 for directly connecting the first dummy ground pad 380 to the ground pad 370 adjacent to the first dummy ground pad 380, and a second connection line 610 connecting the first dummy ground pad 380 to the second dummy ground pad 390 electrically connected to the ground metal pattern 330 through the additional connection line 420.

Summarizing the configurations by the above-mentioned various embodiments of the present disclosure, the customer system connector unit 230 of the driving PCB 200 connecting the display panel 110 to the customer system 120 includes at least one floated dummy ground pad, and the dummy ground pads are each electrically coupled to an adjacent ground pad through connection lines.

At this time, the dummy ground pad is the first dummy ground pad 380 disposed between the pair of signal pads 322 and 322' repectively attached to the corresponding end of the pair of signal lines formed in the main substrate area 210 of the driving PCB 200. The above-mentioned ground pad may be the first ground pad 370 directly extending from the ground metal pattern 330, which is formed in the main substrate area, and may be the adjacent second dummy ground pad 390 electrically coupled to the ground metal pattern 330 or the first ground pad 370 through the additional line.

That is, since the second dummy ground pad 390 is disposed between at least two pairs of signal pads, and is connected to the ground metal pattern 330 or the first ground pad 370 through the additional connection lines 420 and 420', the second dummy ground pad 390 acts as a type of a ground pad.

At this time, the connection line for electrically coupling the first dummy ground pad 380 to a ground area may include a first connection line 630 directly connecting the first dummy ground pad 380 to the first ground pad 370, and a second connection line 610 connecting the first dummy ground pad 380 to the second dummy ground pad 390 adjacent to the first dummy ground pad 380, in this case, the second dummy ground pad is electrically coupled to the ground metal pattern through the additional connection line.

The dummy ground pads 380 and 390 defined in embodiments of the present disclosure should be understood as all pads to which the ground signal is electrically applied in order to provide the electrical stability of the pair of signal lines and the like when the driving PCB 200 is connected to the customer system 120, and which are floated when the driving PCB 200 is not connected to the customer system 120.

When the embodiment described above is used, since the plurality of dummy ground pads which are floated in order to provide the electrical stability when the driving PCB is connected to the customer system are included in the connector unit of the driving PCB, and the plurality of dummy ground pads are electrically coupled to the ground area, the plurality of dummy ground pads are taken out of the floating state. Therefore, even in the state in which the driving PCB is not connected to the customer system, the damage of the display panel or the driving circuit unit from the external electrical shock such as ESD, EOS, and the like may be prevented.

Thus, electrical strength of the connector unit of the driving PCB connecting the display panel or the LCM to the customer system such as the user terminal, the test equipment or the like may be improved. Therefore, the display panel and the like may be protected from the external abnormal charge.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Accordingly, the embodiments disclosed in the present disclosure are merely to not limit but describe the technical spirit of the present disclosure. Further, the scope of the technical spirit of the present disclosure is limited by the embodiments. The scope of the present invention shall be construed on the basis of the accompanying claims in such a manner that all of the technical ideas included within the scope equivalent to the claims belong to the present disclosure.

What is claimed is:

1. A driving printed circuit board (PCB) for a display device, which is for connecting a display panel with a customer system, the driving PCB comprising
   a main substrate area including at least one display panel driving element; and
   a customer system connector unit disposed at one end of the main substrate area and connected to the customer system,
   wherein the customer system connector unit includes:
   one or more ground pads extending from a ground pattern disposed in the main substrate area;
   one or more dummy ground pads to being connected to the customer system; and a connection line electrically connecting at least one among the dummy ground pads to an adjacent ground pad.

2. The driving PCB for the display device of claim 1, wherein the dummy ground pad includes a first dummy ground pad disposed between two signal pads included in a pair of signal pads attached to one end of a pair of signal lines disposed in the main substrate area.

3. The driving PCB for the display device of claim 2, wherein the ground pad includes a first ground pad directly extending from the ground metal pattern disposed in the main substrate area.

4. The driving PCB for the display device of claim 3, wherein the dummy ground pad includes at least one second dummy ground pad disposed between at least two pairs of signal pads, and the connection line includes an additional connection line connecting the second dummy ground pad to the ground metal pattern disposed in the main substrate area.

5. The driving PCB for the display device of claim 3, wherein the dummy ground pad includes at least one second dummy ground pad disposed between at least two pairs of signal pads, and the connection line includes a first connection line connecting the first dummy ground pad with the first ground pad, and a second connection line connecting the first dummy ground pad with the second dummy ground pad.

6. The driving PCB for the display device of claim 2, wherein a ground signal is electrically applied to the dummy ground pad when the dummy ground pad is connected to the customer system in order to provide an electrical stability of the pair of signal lines, and the dummy ground pad is floated when the dummy ground pad is not connected to the customer system.

7. A display device comprising:
a display panel; and
a driving Printed Circuit Board (PCB) for connecting the display panel with a customer system,
wherein the driving PCB includes a main substrate area including at least one display panel driving element, and a customer system connector unit disposed at one end of the main substrate area and connected to the customer system, and
wherein the customer system connector unit includes:
one or more ground pads extending from a ground pattern disposed in the main substrate area;
one or more dummy ground pads to being connected to the customer system; and
a connection line electrically connecting at least one among the dummy ground pads to an adjacent ground pad or the ground pattern.

8. The display device of claim 7, wherein the dummy ground pad includes a first dummy ground pad disposed between two signal pads included in a pair of signal pads attached to one end of a pair of signal lines disposed in the main substrate area.

9. The display device of claim 8, wherein the ground pad includes a first ground pad directly extending from the ground metal pattern disposed in the main substrate area.

10. The display device of claim 9, wherein the dummy ground pad includes at least one second dummy ground pad disposed between at least two pairs of signal pads, and the connection line includes an additional connection line connecting the second dummy ground pad to the ground metal pattern disposed in the main substrate area.

11. The display device of claim 9, wherein the dummy ground pad includes at least one second dummy ground pad disposed between at least two pairs of signal pads, and the connection line includes a first connection line connecting the first dummy ground pad with the first ground pad, and a second connection line connecting the first dummy ground pad with the second dummy ground pad.

12. The display device of claim 8, wherein a ground signal is electrically applied to the dummy ground pad when the dummy ground pad is connected to the customer system in order to provide an electrical stability of the pair of signal lines, and the dummy ground pad is floated when the dummy ground pad is not connected to the customer system.

13. The display device of claim 8, wherein each pair of signal pads is used for providing a pair of differential signals.

14. A customer system connector unit for connecting a display panel with a customer system comprising:
a substrate including a main substrate area including at least one display panel driving element; and
one or more ground pads disposed at one end of the main substrate area of the substrate and extending from a ground pattern disposed in the main substrate area;
one or more dummy ground pads to being connected to the customer system; and
a connection line electrically connecting at least one among the dummy ground pads to an adjacent ground pad or the ground pattern.

15. The customer system connector unit of claim 14, wherein the dummy ground pad includes a first dummy ground pad disposed between two signal pads included in a pair of signal pads attached to one end of a pair of signal lines disposed in the main substrate area.

16. The customer system connector unit of claim 15, wherein the ground pad includes a first ground pad directly extending from the ground metal pattern disposed in the main substrate area.

17. The customer system connector unit of claim 15, wherein a ground signal is electrically applied to the dummy ground pad when the dummy ground pad is connected to the customer system in order to provide an electrical stability of the pair of signal lines, and the dummy ground pad is floated when the dummy ground pad is not connected to the customer system.

18. The customer system connector unit of claim 15, wherein each pair of signal pads is used for providing a pair of differential signals.

19. The customer system connector unit of claim 16, wherein the dummy ground pad includes at least one second dummy ground pad disposed between at least two pairs of signal pads, and the connection line includes an additional connection line connecting the second dummy ground pad to the ground metal pattern disposed in the main substrate area.

20. The customer system connector unit of claim 16, wherein the dummy ground pad includes at least one second dummy ground pad disposed between at least two pairs of signal pads, and the connection line includes a first connection line connecting the first dummy ground pad with the first ground pad, and a second connection line connecting the first dummy ground pad with the second dummy ground pad.

* * * * *